US008300683B1

(12) United States Patent
Vecera

(10) Patent No.: US 8,300,683 B1
(45) Date of Patent: Oct. 30, 2012

(54) DIFFERENTIAL ENERGY DIFFERENCE INTEGRATOR

(75) Inventor: Dusan Vecera, Los Gatos, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 148 days.

(21) Appl. No.: 12/190,757

(22) Filed: Aug. 13, 2008

Related U.S. Application Data

(62) Division of application No. 10/933,183, filed on Sep. 1, 2004, now Pat. No. 7,417,485.

(60) Provisional application No. 60/505,296, filed on Sep. 23, 2003.

(51) Int. Cl.
*H03H 7/30* (2006.01)

(52) U.S. Cl. ......................... 375/229; 327/330; 327/336

(58) Field of Classification Search .................. 327/330, 327/336, 344, 350–352; 375/229
See application file for complete search history.

(56) References Cited

U.S. PATENT DOCUMENTS 4,680,553 A 7/1987 Kimura et al.
4,794,342 A 12/1988 Kimura
4,972,512 A 11/1990 Garskamp
5,057,717 A 10/1991 Kimura
5,122,760 A 6/1992 Nishijima
5,467,046 A 11/1995 Kimura
5,475,328 A 12/1995 Kimura
5,506,537 A 4/1996 Kimura
5,561,392 A * 10/1996 Kimura .......................... 327/350
6,256,220 B1 * 7/2001 Kamp ........................... 365/145
7,088,793 B1 * 8/2006 Mickelson et al. ........... 375/341
7,295,605 B2 11/2007 Gai et al.
7,417,485 B1 8/2008 Vecera

OTHER PUBLICATIONS

Kimura Katsuji, Some Circuits Design Techniques for Bipolar and MOS Pseudologarithmic Rectifiers Operable on Low Supply Voltage, IEEE Trans. Circuit and System I, vol. 39, No. 9, Sep. 1992, pp. 771-777.

USPTO Notice of Allowance for U.S. Appl. No. 10/933,183 dated Apr. 24, 2008; 6 pages.

USPTO Requirement for Restriction for U.S. Appl. No. 10/933,183 dated Jan. 7, 2008; 5 pages.

* cited by examiner

*Primary Examiner* — Leon-Viet Nguyen

(57) ABSTRACT

Embodiments of the invention are generally directed to a high-speed differential energy difference integrator (EDI) for adaptive equalizers. In an embodiment, the EDI includes two differential full-wave rectifiers providing differential outputs that are cross-coupled to the inputs of an integration capacitor. In one embodiment, the active areas of the transistors of the differential full-wave rectifiers are substantially the same.

7 Claims, 4 Drawing Sheets

Conventional full-wave rectifier 200

Full-Wave Rectifier 500

Simulation 600
For k=1 the output differential current is zero, substantially superimposing the line on the x-axis.

DIFFERENTIAL ENERGY DIFFERENCE INTEGRATOR

RELATED APPLICATION

This application is a divisional of 10/933,183 filed Sep. 1, 2004 now U.S. Pat. No. 7,417,485, which claims the benefit of U.S. Provisional Patent Application Ser. No. 60/505,296, filed on Sep. 23, 2003, the entire contents of both of which are hereby incorporated by reference.

TECHNICAL FIELD

Embodiments of the invention generally relate to the field of electronic circuitry and, more particularly, to equalizer circuitry.

BACKGROUND

Equalization functions are used to compensate for frequency specific attenuation of signals that can occur when a signal is transmitted through a transmission line. The amplitude of the signal on the transmitting side is called the launch amplitude. On the receiving side of the transmission line, the amplitude of the received signal may be significantly less than the launch amplitude due to attenuation. The level of attenuation is related to the frequency of the signal passing through the transmission line as well as the length of the transmission line.

An exemplary communications system may include a transmitter, a transmission line, an equalizer circuit coupled to the receiving end of the transmission line, and a receiver. The equalizer corrects the output of the transmission line, replacing the frequencies attenuated by the transmission line and producing a signal from which the receiving chip can extract the transmitted bits. In applications with a variable length transmission line an adaptive equalizer is used. Adaptive equalizers utilize a feedback loop to compensate for changes in attenuation of the input signal due to the variable length of the transmission line. The transmission line may include a conductor, an optical fiber, a wireless link, or any other path by which signals may travel from one point to another.

A conventional adaptive equalizer system typically includes: an energy difference integrator (EDI), an inverse cable filter, a slicer, and an output driver. The term "slicer" refers to an element that delivers an output signal whose amplitude range corresponds to input-signal voltages between two predetermined limits (e.g., a clipper-limiter). The energy difference integrator compares the signal amplitude after the inverse cable filter with the signal amplitude after the slicer. The difference between those signals serves as a feedback control signal for the inverse cable filter.

FIG. 1 is a block diagram of conventional EDI 100. As shown in FIG. 1, the functions of conventional EDI 100 are usually implemented in several separate blocks (e.g., full-wave rectifiers 110-120, difference circuit 130, and integrator 140), which results in the use of more die area than is desirable. In addition, the implementation is often single-ended, which increases the sensitivity of the circuit to noise resulting in higher jitter. The term "single ended" refers to a circuit in which signals are referenced to a "common connection" in the circuit. Typically, the common connection is ground.

As shown in FIG. 1, a conventional EDI circuit may include a conventional full wave rectifier circuit. A conventional full wave rectifier circuit is described by Kimura Katsuji in a paper entitled, "Some Circuit Design techniques for Bipolar and MOS Pseudologarithmic Rectifiers Operable on Low Supply Voltage", IEEE Trans. Circuit and Systems I, vol. 39, No. 9, September 1992, p. 771-777. FIG. 2 is a circuit diagram of conventional full-wave rectifier 200. Conventional full wave rectifier 200 is based on transistors that have different emitter areas. That is, the rectification is achieved by intentionally using different emitter areas k. For example emitter areas 202 and 204 vary from emitter areas 206 and 208 by a factor of k. The emitter degeneration is used only to increase the input dynamic range. Thus, the conventional solution teaches away from using the same emitter areas. Disadvantages of the conventional solution include that to achieve suitable rectification the factor k has to be bigger than 1, for example in a preferred embodiment of the conventional solution, the value of k is eight. This significantly limits the bandwidth of the stage making the circuit unusable for high-speed designs. It would be desirable to have an improved EDI function that uses smaller die area, is less sensitive to noise, does not limit bandwidth, and can be used at high-speed.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to a high-speed differential energy difference integrator (EDI) for adaptive equalizers. In an embodiment, the EDI includes two differential full-wave rectifiers providing differential outputs that are cross-coupled to the inputs of an integration capacitor. In one embodiment, the active areas of the transistors of the full-wave rectifiers are substantially the same. As is further described below, the EDI has a low sensitivity to noise because it is fully differential. The term "fully differential" refers to a circuit in which both the inputs and the outputs are differential. In addition, embodiments of the invention are suitable for high-speed/low-voltage applications.

Figure 1:
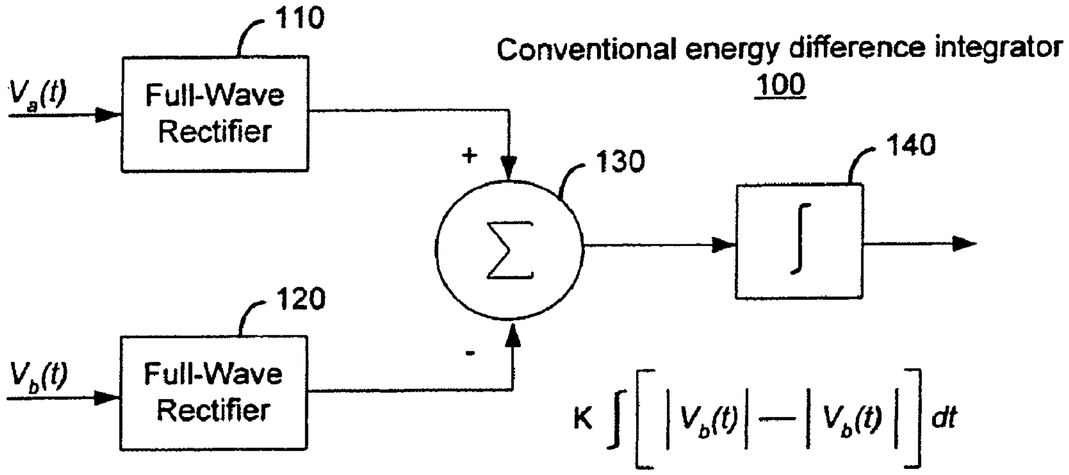
FIG. 1 is a block diagram of a conventional energy difference integrator circuit.
Figure 2:
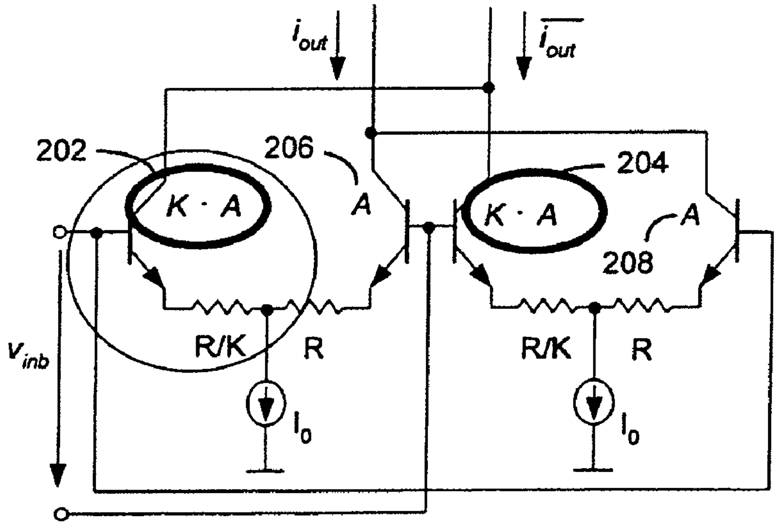
FIG. 2 is a circuit diagram of a conventional full-wave rectifier circuit.
Figure 3:
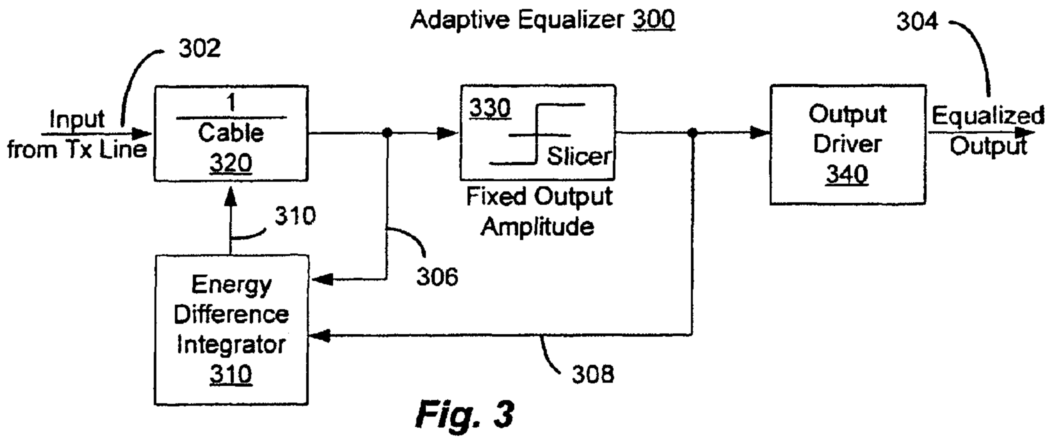
FIG. 3 is a block diagram of an adaptive equalizer system comprising an energy difference integrator implemented according to an embodiment of the invention.

FIG. 3 is block diagram of an adaptive equalizer system 300 including an energy difference integrator implemented according to an embodiment of the invention. The illustrated embodiment of adaptive equalizer system 300 includes: energy difference integrator 310, inverse cable filter 320, slicer 330, and output driver 340. In an alternative embodiment, adaptive equalizer system 300 may include more elements, fewer elements, and/or different elements.

Inverse cable filter 320 receives an input signal from a transmission source over transmission line 302. Transmission line 302 may be, for example, a conductor, an optical fiber, a wireless link, or any other path by which signals may travel from one point to another. Typically, the received signal includes components having different frequencies and those components are unequally attenuated by transmission line 302. In an embodiment, inverse cable filter 320 inversely models the transfer function of transmission line 302. When applied to the received signal, inverse cable filter 320 compensates, at least partly, for the unequal frequency attenuation imparted by transmission line 302.

Slicer 330 receives as an input a signal from inverse cable filter 320. The received signal includes frequency attenuation from transmission line 302. For example, rather than being shaped like a pulse, the received signal may have a sinusoidal waveform. Slicer 330, as the name implies, "slices" the sinusoidal signal to provide a more pulse-like waveform. Output driver 340 receives the signal from slicer 330 and provides equalized output signal 304.

Energy difference integrator (EDI) 310 receives as inputs the output of inverse cable filter 320 (as shown by 306) and the output of slicer 330 (as shown by 308). EDI 310 compares the energy of signal 306 with the energy of signal 308. The difference in energy between these signals serves as a feedback control signal for inverse cable filter 320 as shown by 310.

In contrast to conventional EDIs, EDI 310 is implemented as a single block to reduce the die area of the circuit. That is, the functions of rectification, difference, and integration are implemented in a single block. In an embodiment, EDI 310 is less sensitive to signal noise because it is fully differential. In addition, EDI 310 may be implemented with fewer transistors (stacked between the power supply and ground) than a conventional EDI which enables it to operate at lower voltages.

In an embodiment, EDI 310 includes two full-wave rectifiers having current outputs that are cross-coupled in a unique way to provide a differential current for driving an integration capacitor. In one embodiment, the full-wave rectifiers may include transistors that have emitter areas that are substantially the same (e.g., within +/−10 percent of each other) to provide bandwidths that are suitable for high-speed designs. EDI 310 is further described below with reference to FIGS. 4-6.

Figure 4:
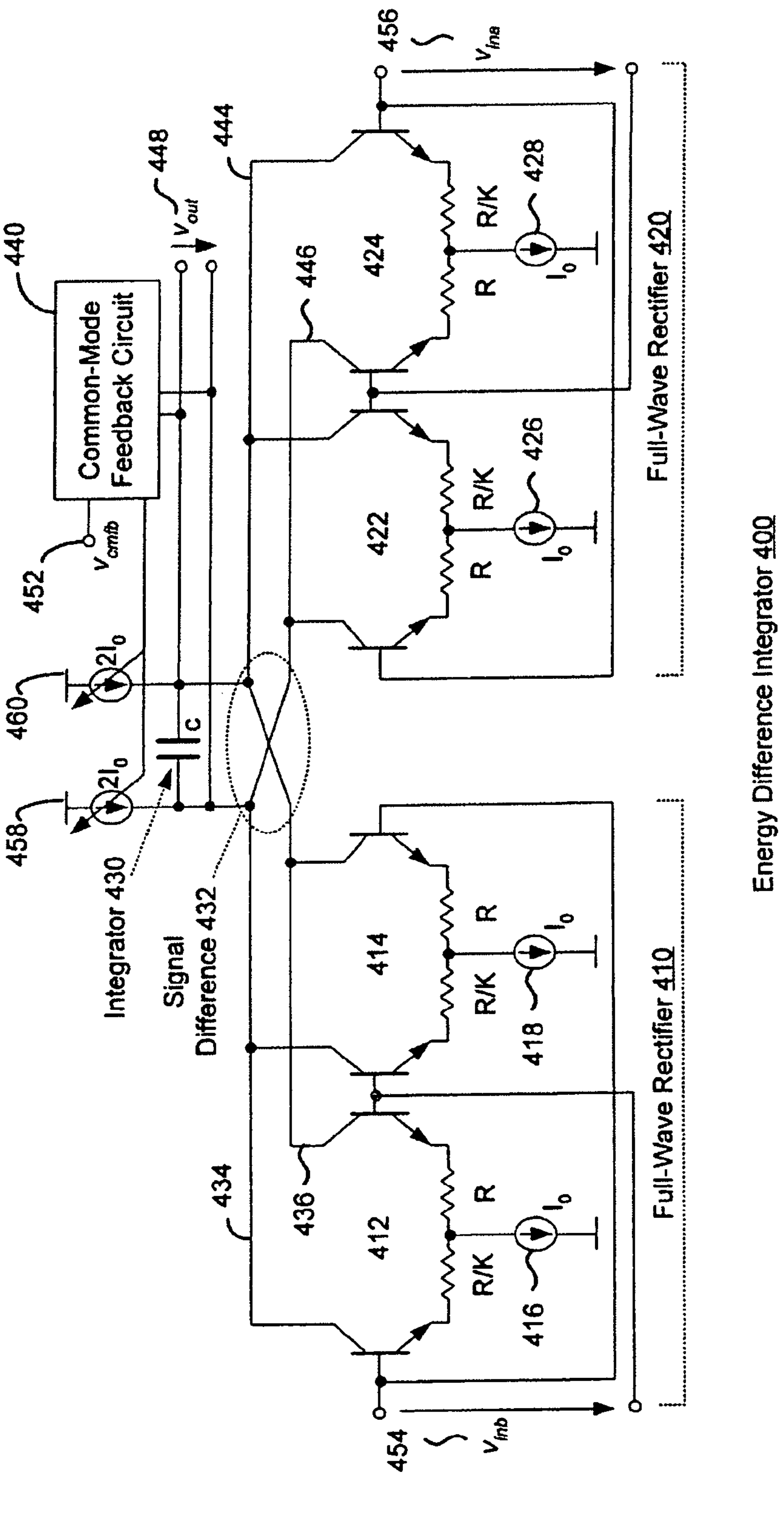
FIG. 4 is a circuit diagram of an energy difference integrator circuit implemented according to an embodiment of the invention.

FIG. 4 is a circuit diagram of differential EDI 400, implemented according to an embodiment of the invention. In an embodiment, differential EDI 400 includes full-wave rectifiers 410-420, integrator 430, and common-mode feedback circuit 440. While the illustrated embodiment is implemented with Bipolar Junction Transistors (BJTs), in an alternative embodiment, EDI 400 may be implemented with Metal Oxide Semiconductor (MOS) technology.

Full-wave rectifier 410 includes differential transistor pairs 412-414 and current sources 416-418. Similarly, full-wave rectifier 420 includes differential transistor pairs 422-424 and current sources 426-428. In an embodiment, full-wave rectifiers 410 and 420 provide a fully differential input to integrator 430 as shown by 432. Full-wave rectifier 410 provides current outputs 434-436 and full-wave rectifier 420 provides current outputs 444-446. In an embodiment, output 434 of full-wave rectifier 410 is cross-coupled with output 446 of full-wave rectifier 420 to provide an input to integrator 430. Similarly, output 444 of full-wave rectifier 420 is cross-coupled with output 436 of full-wave rectifier 410 to provide another input to integrator 430.

In an embodiment, integrator 430 is implemented as a capacitor. In an alternative embodiment, integrator 430 may implemented with more and/or different circuit elements. Common-mode feedback circuit 440 sets the common-mode point of EDI output 448 based, at least in part, on reference signal 452. Common-mode feedback circuit 440 operates to keep the common mode of the output signal substantially the same over a wide range of values for output signal 448. In an embodiment, common mode feedback circuit 440 adjusts current sources 458-460, as needed, to maintain the common mode voltage. The "common-mode point" refers to the average of the two input signals (e.g., in this case, the average of the two outputs of integrator 430). In one embodiment, common-mode feedback circuit 440 is implemented as a differential amplifier common-mode feedback circuit. In an alternative embodiment, common-mode feedback circuit 440 may be implemented as, for example, a switched-capacitor common-mode feedback circuit, a resistor-averaged common-mode feedback circuit, and the like.

In general terms, the role of EDI 400 is to provide an output signal (e.g., signal 448) that is proportional to the difference in energy between two input signals (e.g., between signals 454 and 456). In the case of an adaptive equalizer (e.g., adaptive equalizer system 300, shown in FIG. 3), EDI 400 may compare the difference in energy of a signal before a slicer (e.g., slicer 330, shown in FIG. 3) and after the slicer to provide a feedback control signal to an inverse cable filter (e.g., inverse cable filter 320, shown in FIG. 3). The amount of gain that the inverse cable filter imparts to a received signal may be based, at least in part, on this feedback control signal.

EDI 400 receives input signals 454 and 456. In an embodiment, one of signals 454 and 456 is the input signal to a slicer and the other is the output signal of the slicer. A person of ordinary skill in the art appreciates that EDI 400 is symmetrical and, therefore, either signal may be applied to either input. Full-wave rectifier 410 rectifies input signal 454 and full-wave rectifier 420 rectifies input signal 456. A rectifier refers to an element that converts alternating current to direct current. A full-wave rectifier refers to an element that rectifies both halves of an input sinusoid.

In an embodiment, full-wave rectifiers 410 and 420 each provide a fully differential current output. In the illustrated embodiment, the difference between the outputs of full-wave rectifiers 410 and 420 is obtained by cross-coupling the fully differential outputs as shown by 432. That is, output signal 434 is cross-coupled with output signal 446 to provide an input to integrator 430. Similarly, output signal 444 is cross-coupled with output signal 436 to provide the other input to integrator 430.

In an embodiment, full-wave rectifiers 410 and 420 have a novel implementation suitable for high-speed designs. In one embodiment, the active area of each transistor in the full-wave rectifier is substantially the same. The term "active area" refers to the cross-sectional area of an active region of a transistor. For example, the active area of a BJT transistor is the emitter area. The term "emitter area" refers to the cross-sectional area of the p-n junction formed by the emitter and the base. The active area of a MOS transistor refers to, for example, the cross-sectional area of the channel formed by the gate.

Figure 5:
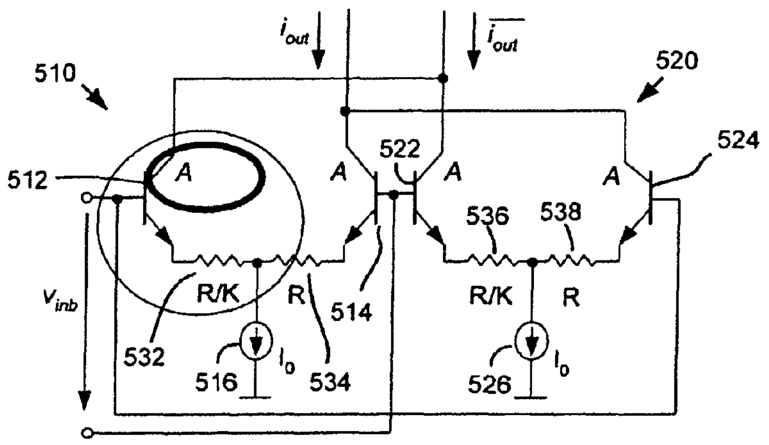
FIG. 5 is a circuit diagram of a full wave rectifier circuit implemented according to an embodiment of the invention.

FIG. 5 is a circuit diagram of high-speed full-wave rectifier 500 implemented according to an embodiment of the invention. In one embodiment, each of the full-wave rectifiers of an EDI (e.g., EDI 400, shown in FIG. 4) is substantially similar to full-wave rectifier 500. Full-wave rectifier 500 includes BJT differential pairs 510-520. BJT differential pair 510 includes transistors 512-514, resistors 532-534, and current source 516. Similarly, BJT differential pair 520 includes transistors 522-524, resistors 536-538, and current source 526. In an alternative embodiment, transistors 512-514 and 522-524 are implemented with MOS technology.

In conventional full-wave rectifiers, rectification is achieved by intentionally using different active areas (e.g., different emitter areas) for the transistors within a differential pair. In such conventional rectifiers, the bandwidth of the rectifier is inversely proportional to the magnitude of the difference in size of the active areas. Since the magnitude of the difference in size of the active areas is typically large, the bandwidth of conventional rectifiers is typically small. Thus, conventional full-wave rectifiers are not suitable for high-speed designs.

In contrast, the transistors in high-speed full-wave rectifier 500 have active areas that are substantially the same. For example, in the illustrated embodiment, transistors 512-514 and 522-524 all have emitter areas that are substantially equal to A. In one embodiment, the term "substantially the same" indicates that the difference in the size of the active area from one transistor to another does not vary by more than ten percent.

The rectification of full-wave rectifier 500 is determined by the ratio K of the emitter degeneration resistors of BJT differential pairs 510 and 520. The term "degeneration resistor" refers to a resistor that reduces (e.g., degenerates) a signal (e.g., the emitter signal). The absolute value R of degeneration resistors 532-534 and 536-538 determines the input dynamic range of full-wave rectifier 500. The value of R may be between 5 and 100 and, in one embodiment, the value of R is between 5 and 10. In an embodiment, full-wave rectifier 500 is suitable for high-speed designs because the bandwidth of the rectifier can be made suitably large by selecting an appropriate value R for the degeneration resistors.

In the illustrated embodiment, BJT differential pairs 510 and 520 are emitter-coupled differential pairs of transistors. The term "emitter-coupled" indicates that the emitters of the transistors are coupled to each other (e.g., via the degeneration resistors). In an alternative embodiment, differential pairs of metal-oxide semiconductor field-effect transistors are used instead of BJT differential pairs.

Figure 6:
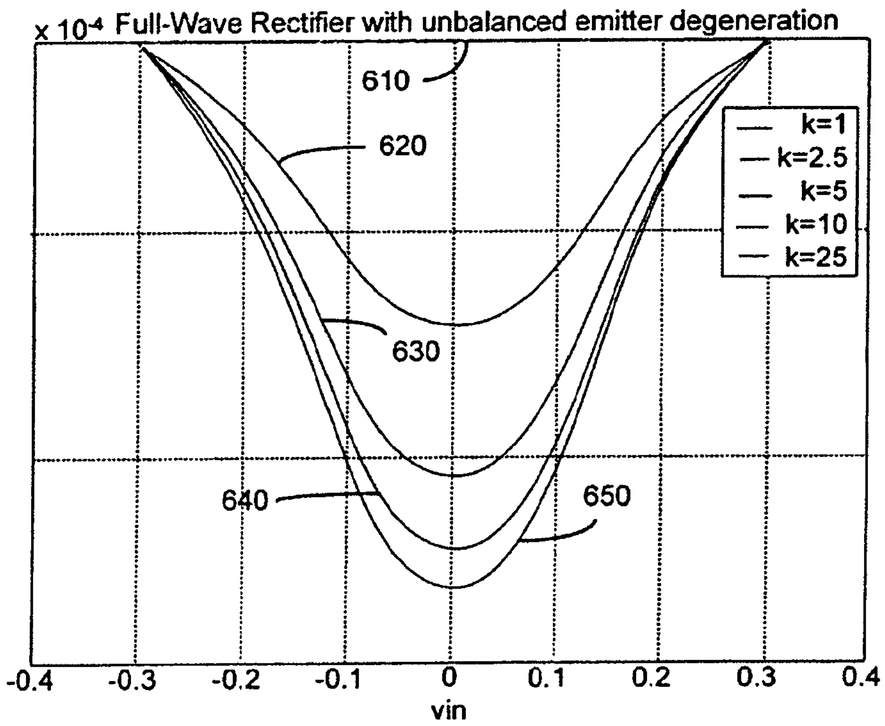
FIG. 6 shows a simulation of a full wave rectifier circuit implemented according to an embodiment of the invention.

FIG. 6 illustrates a simulation 600 of the transfer characteristics for a full-wave rectifier (e.g., full-wave rectifier 500 shown in FIG. 5) implemented according to an embodiment of the invention. The horizontal axis of simulation 600 represents the input differential voltage of the full-wave rectifier. The vertical axis represents the output differential current of the full-wave rectifier. Each of waveforms 610-650 represents a simulation for a full-wave rectifier having a different value for the ratio K of the degeneration resistors. Table 1 provides the values of K for waveforms 610-650.

TABLE 1

| Waveform | Value of K |
|---|---|
| 610 | 1 |
| 620 | 2.5 |
| 630 | 5 |
| 640 | 10 |
| 650 | 25 |

The waveforms shown in simulation 600 illustrate that the full-wave rectifier provides rectification based on unbalanced emitter degeneration. For a resistor ratio of K=1, the output differential current is zero and the circuit does not provide any rectification. Thus, waveform 610 is substantially superimposed along the X-axis. As the resistor ratio K increases, the transfer characteristics of the circuit approach the transfer characteristic of the ideal rectifier.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An equalizer circuit comprising:

an inverse cable filter to receive a signal from a transmission line;

a slicer coupled with the inverse cable filter to receive an output from the inverse cable filter; and an energy difference integrator coupled to receive as a first input the output from the inverse cable filter and coupled to receive as a second input an output from the slicer, wherein the energy difference integrator provides a fully differential feedback control signal to the inverse cable filter, the energy difference integrator comprising a full-wave rectifier, wherein the full-wave rectifier comprises a plurality of transistors each having an active area that is substantially the same.

2. The circuit of claim 1, wherein the energy difference integrator comprises:

a first full-wave rectifier coupled to receive the output from the inverse cable filter, the first full-wave rectifier having a first differential current output including a first current output and a second current output;

a second full-wave rectifier coupled to receive the output from the slicer, the second full-wave rectifier having a first differential current output including a first current output and second current output; and an integrator having a first terminal and a second terminal, wherein the first current output of the first full-wave rectifier and the second current output of the second full-wave rectifier are coupled with the first terminal and the second current output of the first full-wave rectifier and the first current output of the second full-wave rectifier are coupled with the second terminal.

3. The circuit of claim 2, wherein the energy difference integrator further comprises:

a common-mode feedback circuit coupled with the first terminal and the second terminal of the integrator to provide the fully differential feedback control signal to the inverse cable filter.

4. The circuit of claim 2, wherein at least one of the first and second full-wave rectifiers comprises:

a first differential pair of transistors each transistor of the first differential pair having an active area A; and a second differential pair of transistors each transistor of the second differential pair having an active area A, wherein the active area A of all four transistors is substantially the same.

5. The circuit of claim 4, wherein the first differential pair of transistors is a first bipolar junction transistor (BJT) differential pair of transistors; and the second differential pair of transistors is a second BJT differential pair of transistors.

6. The circuit of claim 4, wherein the first differential pair of transistors is a first metal-oxide semiconductor field-effect transistor (MOSFET) differential pair of transistors; and the second differential pair of transistors is a second MOSFET differential pair of transistor.

7. The circuit of claim 5, wherein the first BJT differential pair of transistors is a first emitter-coupled differential pair of transistors; and the second BJT differential pair of transistors is a second emitter-coupled differential pair of transistors.

* * * * *